(12) United States Patent
Adachi

(10) Patent No.: US 6,538,871 B2
(45) Date of Patent: Mar. 25, 2003

(54) CONNECTING STRUCTURE OF FLAT CIRCUIT MEMBER WITH REINFORCED CONNECTION BOUNDARY

(75) Inventor: Hideki Adachi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/878,340

(22) Filed: Jun. 12, 2001

(65) Prior Publication Data

US 2001/0050184 A1 Dec. 13, 2001

(30) Foreign Application Priority Data

Jun. 13, 2000 (JP) .................................... 2000-177276

(51) Int. Cl.$^7$ .............................................. H01H 73/00
(52) U.S. Cl. ...................................................... 361/115
(58) Field of Search .............................. 361/115, 600, 361/644, 651; 174/68.1, 88 B, 94 R

(56) References Cited

U.S. PATENT DOCUMENTS 5,770,818 A    6/1998    Tanaka et al. ............... 174/84

FOREIGN PATENT DOCUMENTS

| EP | 0 106 990 | 5/1984 |
|----|-----------|--------|
| EP | 0 540 319 | 5/1992 |
| EP | 0 651 463 | 5/1995 |
| JP | 2987831 B2 | 10/1999 |
| JP | 11-312568 | 11/1999 |

OTHER PUBLICATIONS

European Search Repot; EP Application No. 01 30 5118; Mar. 5, 2002.

*Primary Examiner*—Edward H. Tso
(74) *Attorney, Agent, or Firm*—Morgan, Lewis & Bockius LLP

(57) ABSTRACT

In a connecting structure, an end portion (11A) of a flexible flat cable (FFC) (11), including a plurality of parallel connectors (12) held between base films (13 and 14), is joined by soldering to wiring terminal patterns (16) formed on a surface of a wiring board (15). The lower covering film (13), which is to be joined to the wiring terminal patterns (16) at the end portion (11A) of the FFC (11), is removed over a length corresponding to a region of soldering levelers (18) formed respectively on the wiring terminal patterns (16). The upper covering film (14) is removed at the end portion (11A) over a region closer to the end of the flat circuit member (11) than an end of the lower covering film (13), and covers part of the wiring terminal patterns (16).

8 Claims, 7 Drawing Sheets

CONNECTING STRUCTURE OF FLAT CIRCUIT MEMBER WITH REINFORCED CONNECTION BOUNDARY

BACKGROUND OF THE INVENTION

1. Technical Field of the Invention

This invention relates to a connecting structure of a flat circuit member such as a flexible flat cable (hereinafter referred to as "FFC") and a flexible printed circuit (hereinafter referred to as "FPC"), and more particularly to a connecting structure of a spiral cable used in a signal transmitting device for steering, for example, an automobile.

2. Related Art

As shown in FIGS. 9 and 10, an FFC (flat circuit member) 1 includes a plurality of parallel rolled conductors 2 (such as copper foils) held between covering films 3 and 4 by the use of an adhesive. An FPC (flat circuit member) has generally the same construction as that of the FFC 1, but differs therefrom in that conductors are formed by etching or plating.

One method of connecting such a flat circuit member to a wiring board is a method of connecting the FFC 1 as shown in FIG. 9. In this connecting method, the covering films 3 and 4, holding the conductors 2 therebetween, are removed over the same length from an end portion of the FFC 1, so that both sides of each conductor 2 are exposed over the same length. Then, the exposed conductors 2 are brought into contact respectively with a plurality of wiring terminal patterns 6 formed on a surface of a wiring board 5, and a heater tip 8 is brought into contact with the exposed conductors 2, thereby soldering these conductors.

A solder leveler 7 is formed on the surface of each wiring terminal pattern 6 over an entire length thereof. The solder leveler 7 is melted by heat transferred from the heater tip 8 through the conductor 2, and thereafter the solder leveler 7 is solidified to join the wiring terminal pattern 6 and the conductor 2 together, and also serves to prevent the oxidation of the connection portion. FIG. 10 is a plan view showing a condition in which the FFC 1 is joined to the wiring board 5, and FIG. 11 is a side-elevational view showing this condition.

FIG. 12 shows a related connecting structure in which the length of those portions of conductors 2, exposed by removing covering films 3 and 4 from an end portion of an FFC 1, is smaller than the length of wiring terminal patterns 6, and the covering films 3 and 4 overlap the wiring terminal patterns 6 at their end portions. In this structure, the length of solder levelers 7 is equal to the length of the exposed portions of the conductors 2 disposed at the end portion of the FFC 1.

In the above related flat circuit member-connecting structures, when each conductor 2 at the end portion of the FFC placed on the solder leveler 7 of the wire terminal pattern 6 is heated, the molten solder adheres to the entire lower surface of the exposed conductor 2 from which the covering film 3 is removed, so that the conductor 2 is soldered. However, when an external stress acts on an end portion 2a of the exposed conductor disposed adjacent to the end edges of the covering films 3 and 4, the stress concentrates on this conductor end portion 2a, which invites a problem that the conduction end portion 2a is liable to be cut.

Particularly when that portion of the FFC, covered with the covering films 3 and 4, is frequently subjected to bending and tensile stress because of the flexibility of the FFC 1, it is desired that the connection portion should have a sufficient durability to withstand such stress. For example, in the case of a flat circuit member (spiral cable) used in a signal transmitting device for steering an automobile, the FFC 1 is deformed in accordance with the rotation of a steering wheel, so that the swinging and pulling of the flat circuit member act on the connection portion. Therefore, it has been desired that the connecting structure of the flat circuit member, used in the steering signal-transmitting device, should be highly desirable.

SUMMARY OF THE INVENTION

It is therefore an object of this invention to provide a highly-reliable connecting structure of a flat circuit member in which a joint strength is increased, and the durability against an external stress is increased.

To achieve the above mentioned objects, according to a first aspect of the invention, there is provided a flat circuit member connecting structure comprising:

In this construction of the invention, the other covering film, overlying and covering the soldering region of the wiring terminal patterns, serves to reinforce the connecting boundary portion between the soldering region of the wiring terminal patterns and the flat circuit member.

According to a second aspect of the invention, in the flat circuit member connecting structure of the first aspect, the flat circuit member is a spiral cable used in a steering signal-transmitting device.

Therefore, in this invention, in addition to the above effects of the invention, the connecting strength of the opposite end portions of the spiral cable, used in the steering signal-transmitting device, is increased, thereby enhancing the reliability.

According to a third aspect of the invention, in the flat circuit member connecting structure of the first aspect, a solder leveler is formed on a surface of each of the wiring terminal patterns.

In this invention, the soldering leveler is formed on the surface of each wiring terminal pattern, and therefore in addition to the above effects of the invention, when the conductor is heated, heat transfers through the conductor, so that the exposed conductor is soldered to the soldering leveler disposed below the conductor.

According to a fourth aspect of the invention, in the flat circuit member connecting structure of the first aspect, each of the wiring terminal patterns is formed integrally with a wiring formed in a through hole formed through the wiring board.

In this invention, each wiring terminal pattern is formed integrally with the wiring formed in the through hole formed through the board, and therefore in addition to the above effects of the invention, even when an external stress is applied to the flat circuit member, this stress is received by the wiring terminal patterns and the wirings in the respective through holes, so that the wiring terminal patterns are prevented from separating from the board.

According to a fifth aspect of the invention, in the flat circuit member connecting structure of the fourth aspect, the wiring in the through hole is formed integrally with a wiring pattern formed on a reverse surface of the wiring board.

In this invention, the wiring in the through hole is formed integrally with the wiring pattern formed on the reverse surface of the board, and therefore in addition to the above effects of the invention, the effect of preventing the separation of the wiring terminal patterns is further enhanced. And besides, a connection member, such as a connector, can be electrically connected to the board, using the wiring patterns formed on the reverse surface of the board. Furthermore, since the wiring patterns are formed on that side of the board facing away from the soldering side, the wiring patterns are prevented from being affected by heat generated during the soldering operation.

According to a sixth aspect of the invention, in the flat circuit member connecting structure of the first aspect, a distal end of each of the conductors is covered with the first and second covering films.

Further to achieve the above mentioned objects, according to a seventh aspect of the invention, there is provided a flat circuit member connecting structure comprising:

According to an eighth aspect of the invention, in the flat circuit member connecting structure of the seventh aspect, an exposed length of each of the exposed conductors in the second covering film side is smaller than that in the first covering film side.

DESCRIPTION OF PREFERRED EMBODIMENT

Preferred embodiments of end structures of flat circuit members of the invention will now be described in detail with reference to the drawings. In each of the embodiments, an FFC is used as the flat circuit member.

First Embodiment

Figure 1:
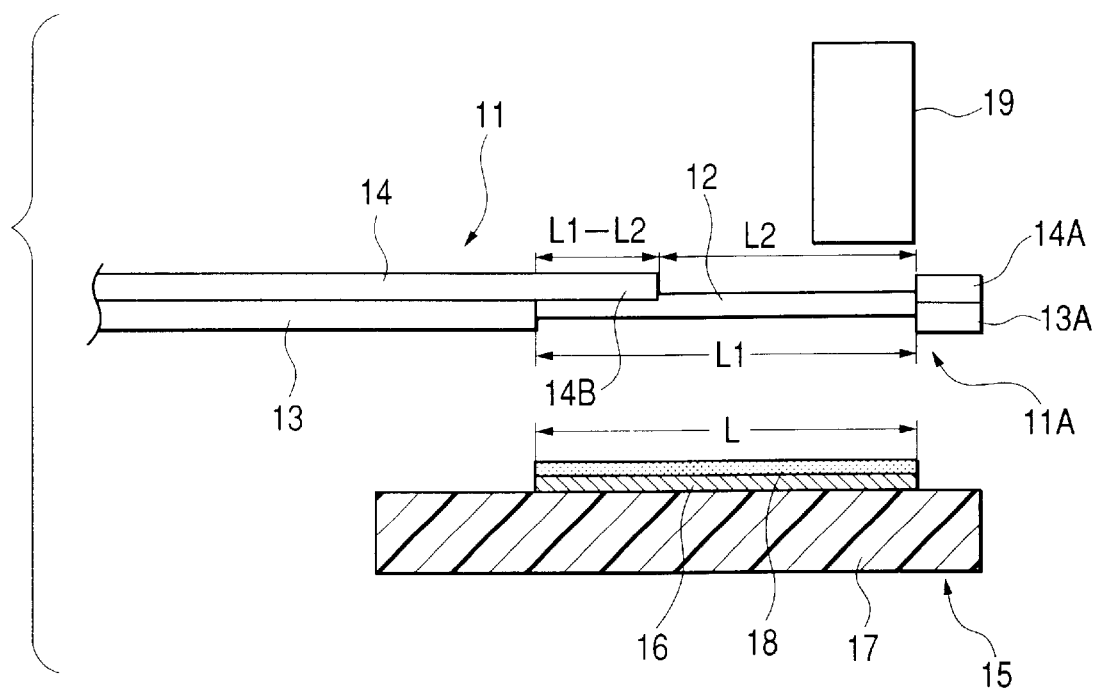
FIG. 1 is a side-elevational, cross-sectional view showing a first embodiment of a flat circuit member-connecting structure of the invention.
Figure 2:
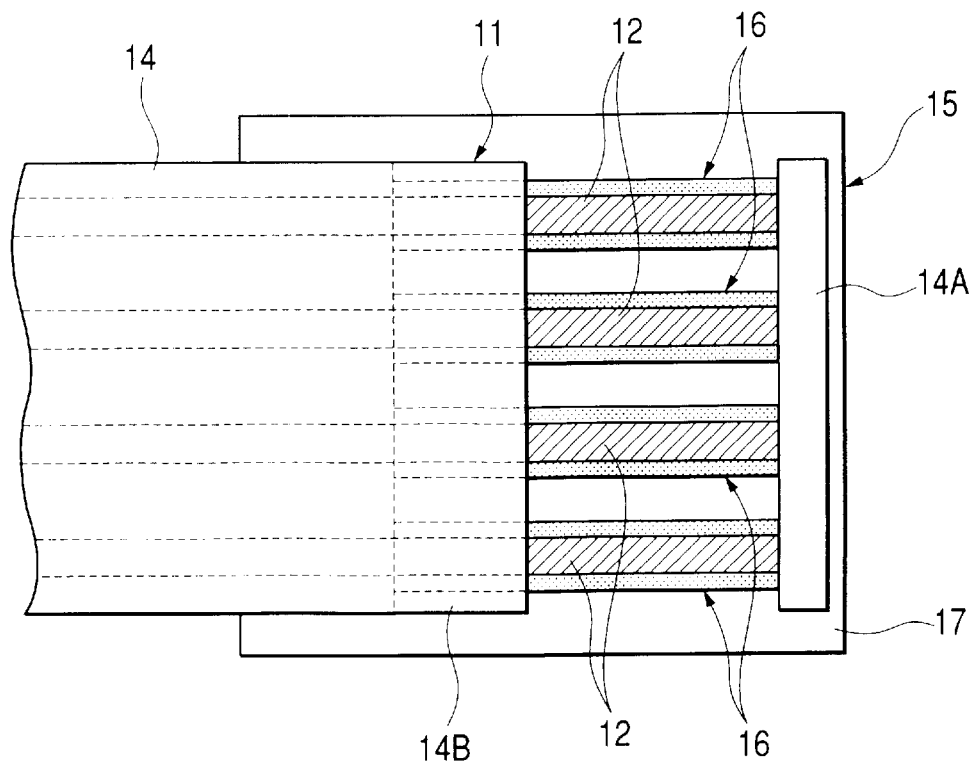
FIG. 2 is a plan view showing the flat circuit member-connecting structure of the first embodiment.
Figure 3:
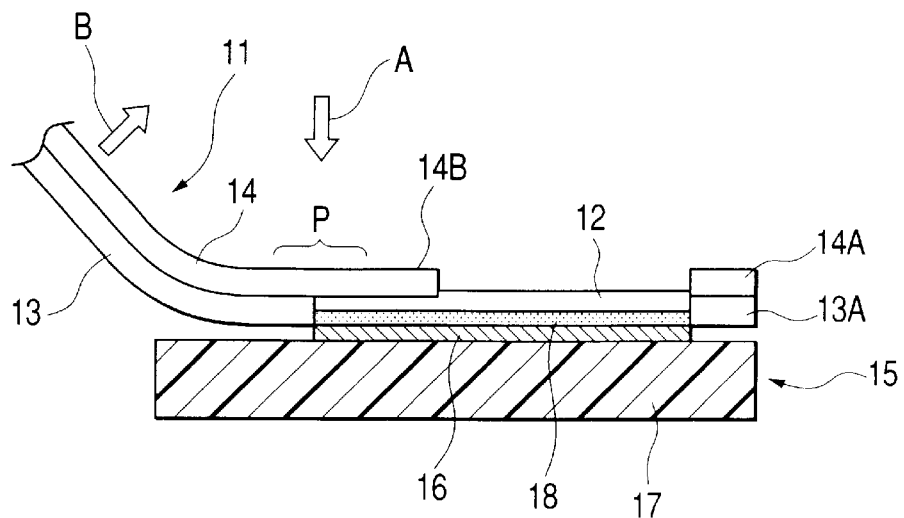
FIG. 3 is a cross-sectional, side-elevational view of an important portion of the flat circuit member-connecting structure of the first embodiment.

FIGS. 1 to 3 show a first embodiment of a flat circuit member-connecting structure of the invention. As shown in FIG. 1, the FFC 11 includes a plurality of parallel rolled conductors 12 (such as copper foils) held between base films (covering films) 13 and 14 by the use of an adhesive. The base films 13 and 14 hold the lower and upper sides of each conductor 12, respectively. In FIG. 2, the conductors 12 are indicated by hatching, and soldering levelers 18 are indicated by dots.

In this first embodiment, base films 13A and 14A of the same length remain at one end portion 11A of the FFC 11. The base film 13 bonded to the lower sides of the conductors 12 at the end portion 11A, expect its end base film 13A, is removed by a length L1 substantially equal to a length of wiring terminal patterns 16 of a wiring board 15 (described later). The base film 14 bonded to the upper sides of the conductors 12 at the end portion 11A, except its end base film 14A, is removed by a length L2 smaller than the length L1. Therefore, the end edge of the base film 14 extends a predetermined distance (L1–L2) from the end edge of the base film 13 toward the end of the FFC 11.

Next, the structure of the wiring board 15 will be described. The wiring board 15 comprises a board 17 made of an insulative resin, and the plurality of wiring terminal patterns 16 arranged on one side of the board 17 at the same pitch as the pitch of the conductors 12. These wiring terminal patterns 16 are end portions of wiring patterns (not shown) formed on the surface of the board 17, and the wiring patterns are adapted to be connected, for example, to connection terminals of a connector. As shown in FIG. 2, the width of each of the wiring terminal patterns 16 is larger than the width of each of the conductor 12. A solder leveler 18 of a predetermined thickness is formed on the surface of each wiring terminal pattern 16 over an entire area thereof, and solder (not shown) is formed on the solder leveler 18.

For connecting the end portion 11A of the FFC 11 to the wiring board 15, the exposed lower surface of each conductor 12, from which the base film 13 is removed by a length equal to the length of the wiring terminal pattern 16, is brought into contact with the soldering leveler 18. Then, a heater tip 19 is brought into contact with the exposed upper surface of each conductor 12 from which the base film 14 is removed, and heat is transferred to the soldering leveler 18 through the conductor 12 to melt the soldering leveler 18, thereby soldering the conductor 12 to the wiring terminal pattern 16. Incidentally, the soldering leveler 18 melted by the heat transferred through the conductor 12 flows between that portion of the conductor 12 covered with an extension portion 14B of the base film 14 and the wiring terminal pattern 16, so that the soldering is positively effected.

In this connecting structure, when an external stress acts on that portion of the FFC 11 indicated by reference character P (that is, disposed in the vicinity of the end edge of the base film 13) as shown in FIG. 3, the extension portion 14B of the base film 14, covering the soldered conductors 12, serves to protect the conductors 12, and also has such a reinforcing function that an abrupt bending stress will not act on the conductors 12. Therefore, the conductors 12 are prevented from being cut at the end edge of the base film 13.

Referring more specifically to this effect, when the external stress, applied in a direction of thick arrow A in FIG. 3, acts on that portion indicated by reference character P, the extension portion 14B of the base film 14, covering the conductors 12, serves to alleviate the shearing stress acting on the conductors 12, and also serves to protect the conductors 12 because of the cushioning properties of the insulative resin forming the base film 14.

On the other hand, when a stress is applied to the FFC 11 in a direction of thick arrow B in FIG. 3, the FFC 11 is flexed in the direction of arrow B. At this time, the extension portion 14B of the base film 14 suppresses the deterioration and fatigue of the conductors 12 since the extension portion 14B has the reinforcing function of preventing the bending stress from concentrating on the conductors 12 at the end edge of the base film 13.

Second Embodiment

Figure 4:
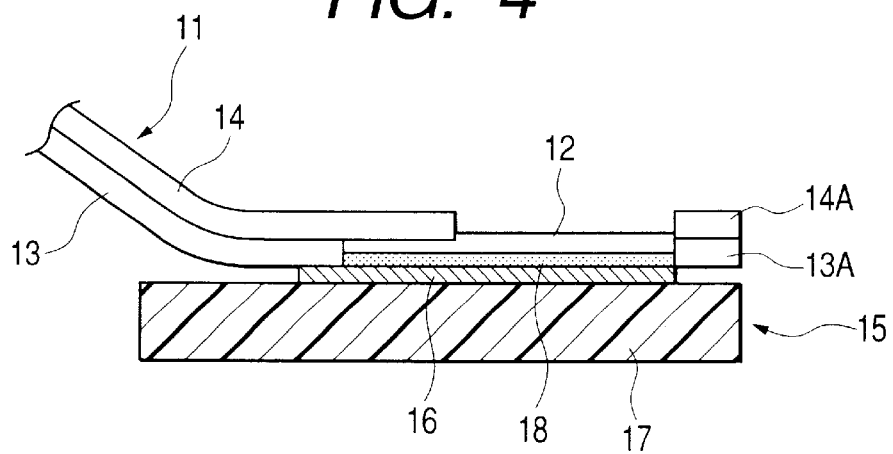
FIG. 4 is a cross-sectional, side-elevational view showing an important portion of a second embodiment of a flat circuit member-connecting structure of the invention.

FIG. 4 is a cross-sectional view showing an important portion of a second embodiment of a flat circuit member-connecting structure of the invention. In this second embodiment, an exposed lower surface of each of conductors 12, which is to be soldered to a wiring terminal pattern 16 of a wiring board 15, is smaller in length than the wiring terminal pattern 16. More specifically, as shown in FIG. 4, an end edge of a base film 13 of an FFC 11 is placed on the wiring terminal patterns 16, and in this condition each conductor 12 is joined to the wiring terminal pattern 16 through a soldering leveler 18. The other construction of this embodiment is generally similar to that of the first embodiment. The operation and effects of this embodiment are generally similar to those of the first embodiment.

Third Embodiment

Figure 5:
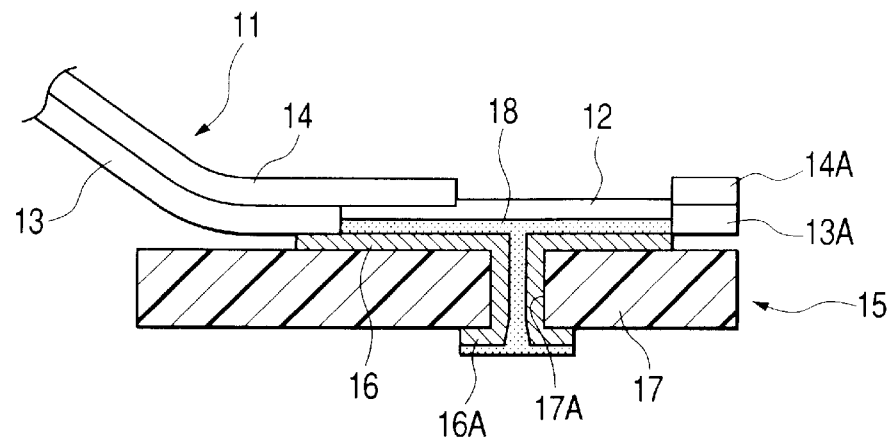
FIG. 5 is a cross-sectional, side-elevational view showing an important portion of a third embodiment of a flat circuit member-connecting structure of the invention.

FIG. 5 is a cross-sectional view showing an important portion of a third embodiment of a flat circuit member-connecting structure of the invention. In this third embodiment, wiring terminal patterns 16 are formed on opposite surfaces of a board 17. Each wiring terminal pattern 16 extends through a through hole 17A formed through the board 17 and has a wiring pattern 16A formed on a reverse surface of the board 17. A solder leveler 18 of an integral construction is formed on an obverse surface of that portion of the wiring terminal pattern 16, formed on the obverse surface of the board 17, and extends through the through hole 17A, and is further formed on a surface of the wiring pattern 16A formed on the reverse surface of the board 17. The other construction of this third embodiment is generally similar to that of the second embodiment.

In the third embodiment, each wiring terminal pattern 16 extends to the reverse surface of the board 17 through the through hole 17A, and each solder leveler 18 is also formed on the obverse and reverse surfaces of the board 17 through the through hole 17A. Therefore, when an external stress is applied to an FFC 11 joined to the wiring terminal patterns 16, the wiring terminal patterns 16 are prevented from being separated from the board 17. Therefore, in addition to achieving the increased joint strength in the first embodiment, the strength of fixing of the wiring terminal patterns 16 to the board 17 is increased, and therefore the reliability of connection of the FFC 11 is greatly enhanced when an external stress is liable to be applied to the FFC 11. Construction of Steering Signal-Transmitting Device to which FFC-Connecting Structure is Applied Next, one example of a steering signal-transmitting device 20, to which the flat circuit member-connecting structure of the invention is applied, will be briefly described with reference to FIG. 6. This steering signal-transmitting device 20 broadly comprises a body portion 21 having an annular recess 21A for receiving a flexible FFC (spiral cable) 11, an outer tube cover 22 for being fitted and fixed relative to the annular recess 21A in the body portion 21, and an inner tube cover 23 having an inner tubular portion 23A for being fitted in a central portion of the outer tube cover 22. The FFC 11 is received in the annular recess 21A in the body portion 21, and more specifically this FFC 11 is received in an annular space formed by the outer tube cover 22 and the inner tube cover 23.

Figure 6:
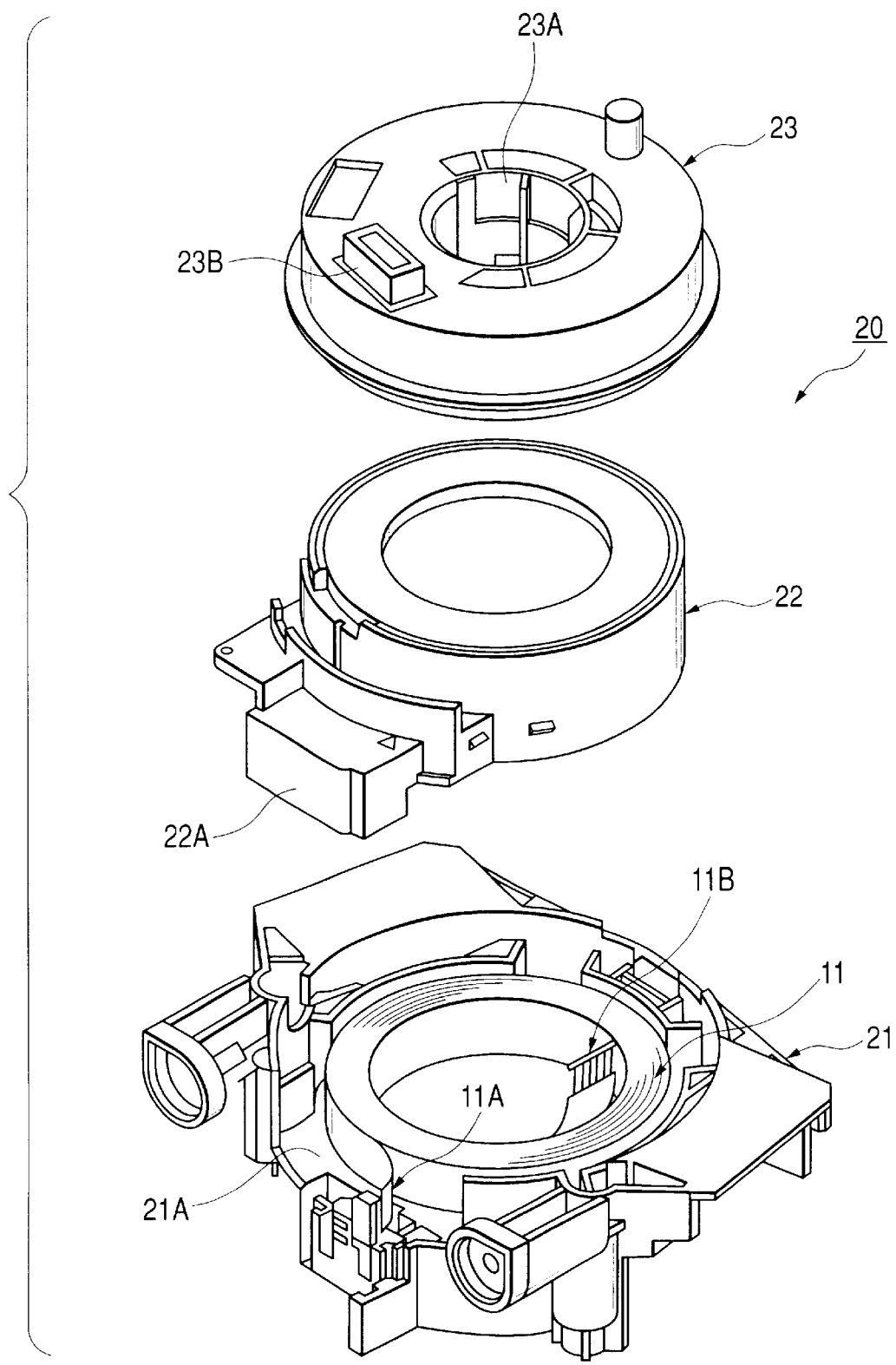
FIG. 6 is an exploded, perspective view of a steering signal-transmitting device to which a flat circuit member-connecting structure of the invention is applied.

The body portion 21 is adapted to be fixed to a steering column (not shown), and the inner tube cover 23 is adapted to be fixed to an upper end portion of a steering shaft (not shown) The inner tube cover 23 is adapted to be fixed and connected to a steering wheel (not shown). Therefore, as shown in FIG. 6, a connector portion 22A, to which an outer end portion 11A of the spirally-wound FFC 11 is adapted to be connected, is formed on the outer tube cover 22, and a connector portion 23B, to which an inner end portion 11B of the FFC 11 is adapted to be connected, is formed on the inner tube cover 23.

Next, one example of a structure, in which the outer and inner end portions 11A and 11B of the FFC (spiral cable) 11 are connected respectively to the connector portions 22A and 23B, will be described with reference to FIGS. 7 and 8.

Figure 7:
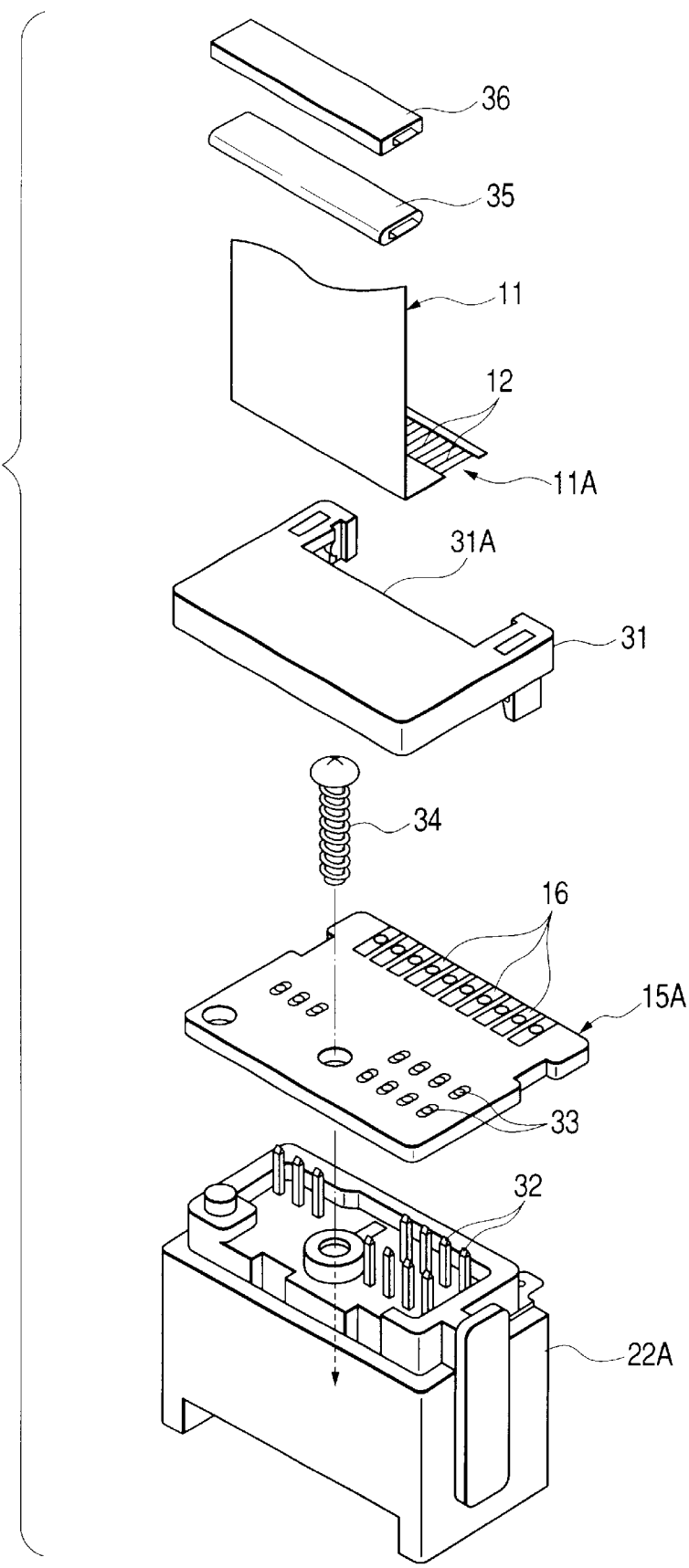
FIG. 7 is an exploded, perspective view showing the construction of a connecting portion for connecting an outer end portion of an FFC when the flat circuit member-connecting structure of the invention is applied to the steering signal-transmitting device.
Figure 8:
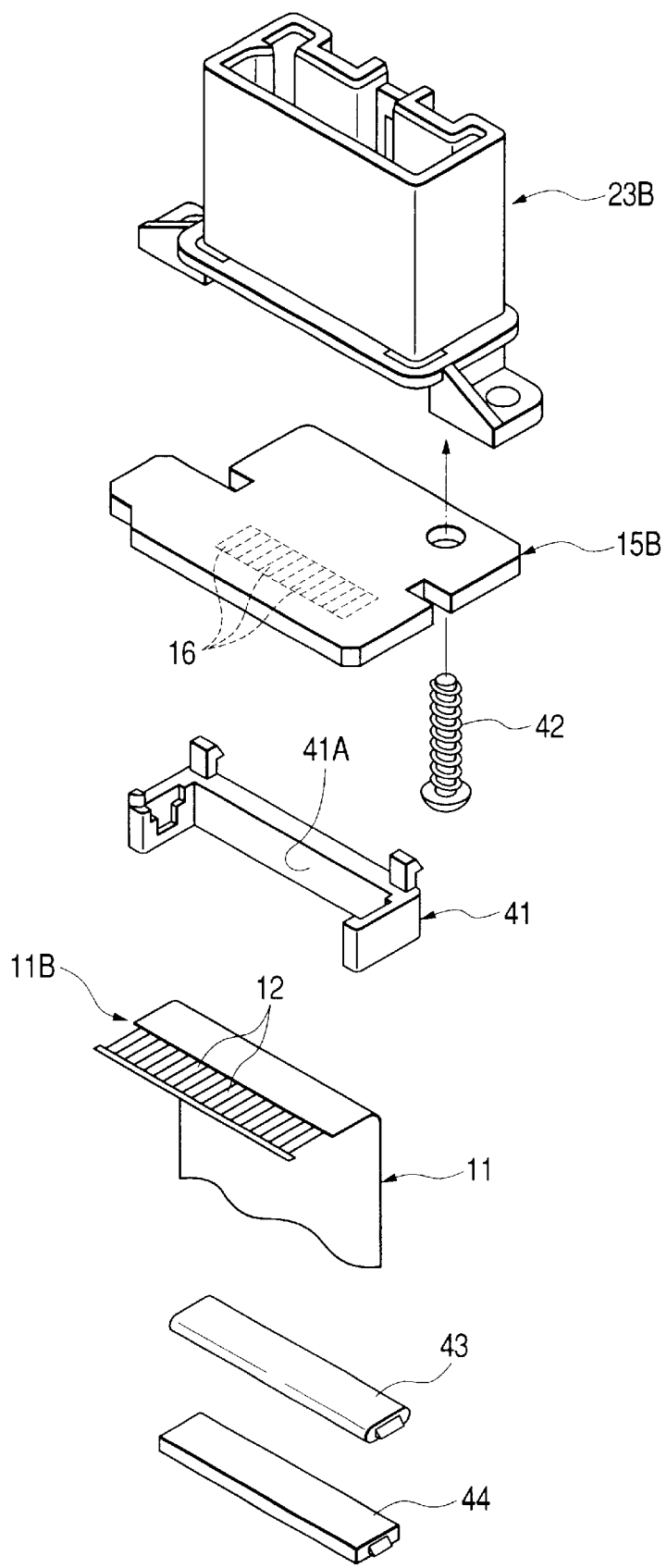
FIG. 8 is an exploded, perspective view showing the construction of a connecting portion for connecting an inner end portion of the FFC when the flat circuit member-connecting structure of the invention is applied to the steering signal-transmitting device.
Figure 9:
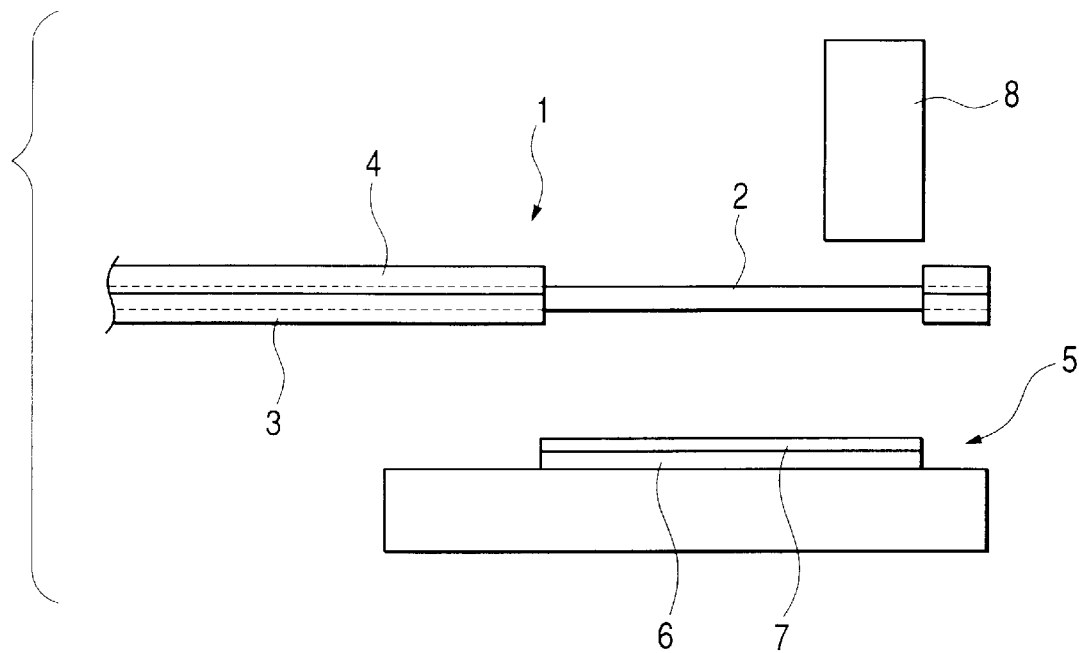
FIG. 9 is a side-elevational view explanatory of a conventional method of connecting a flat circuit member.
Figure 10:
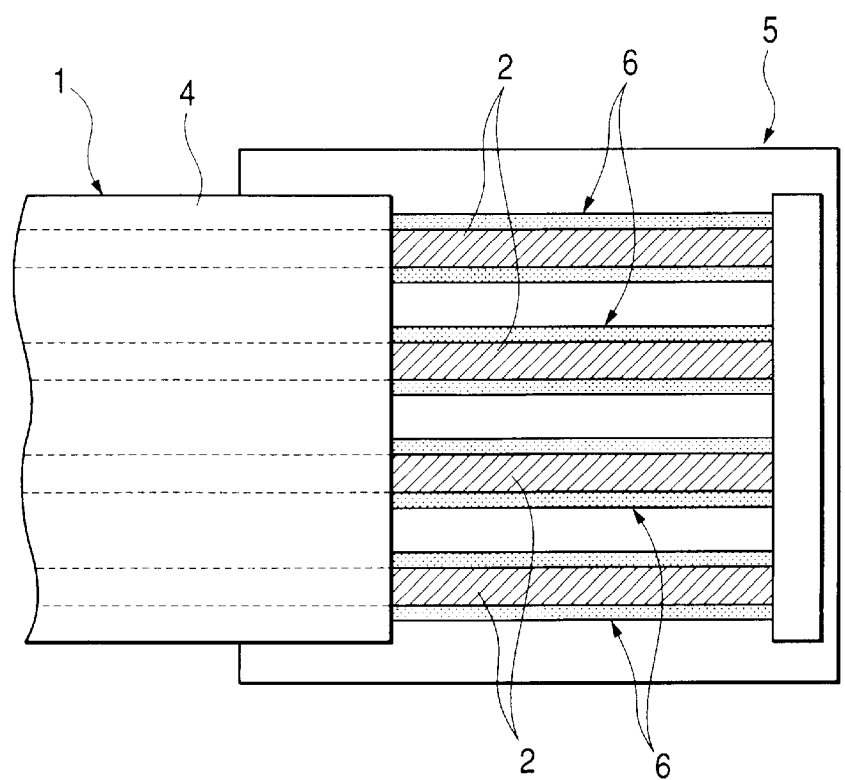
FIG. 10 is a plan view showing a related flat circuit member-connecting structure.
Figure 11:
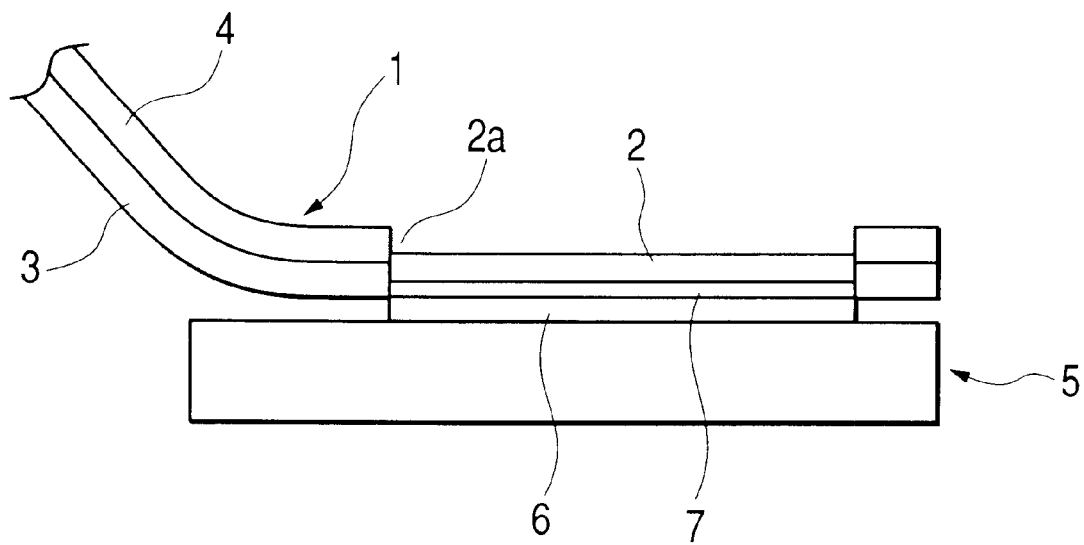
FIG. 11 is a side-elevational view showing the related flat circuit member-connecting structure.
Figure 12:
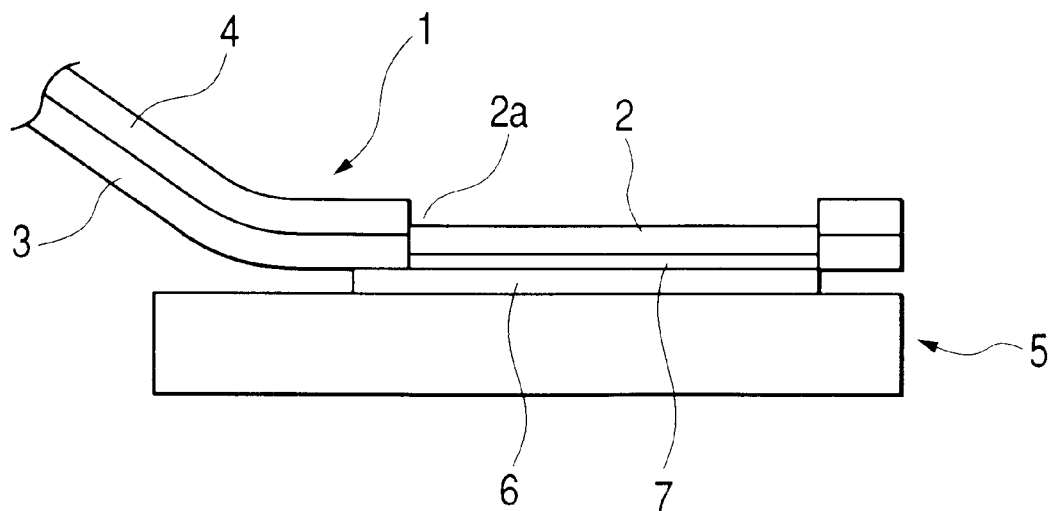
FIG. 12 is a side-elevational view showing another related flat circuit member-connecting structure.

As shown in FIG. 7, the outer end portion 11A of the FFC 11 is connected to a wiring board 15 through a guide recess 31A in an FFC guide plate 31 as in any one of the structures of the above-mentioned first to third embodiments. In the example shown in FIG. 7, the wiring board 15A is of the type in which a through hole is formed in each wiring terminal pattern 16, and therefore this structure corresponds to the connecting structure of the third embodiment.

In the wiring board 15A, a solder leveler 18 is formed on the obverse surface of each wiring terminal pattern 16, an inner surface of the through hole and a wiring pattern on the reverse side of the wiring board. A plurality of connection holes 33 are formed through the other end portions of the wiring patterns formed on the reverse surface of the wiring board 15A, and connection terminals 32, mounted on the connector portion 22A, are passed at their proximal end portions through these connection holes 33, respectively, for electrical connection purposes. By passing the end portions of the connection terminals 32 of the connector portion 22A through the corresponding connection holes 33, the wiring board 15A to which the end portion 11A of the of the FFC 11 is soldered is connected. In FIG. 7, reference numeral 34 denotes a screw by which the wiring board 15A is fixedly secured to the connector portion 22A.

Fixing plates 35 and 36, which hold the end portion 11A of the FFC 11 connected to the wiring board 15A from the upper side, are mounted on the FFC guide plate 31. Thus, the outer end portion 11A of the FFC 11 is connected to the wiring board 15A, and are held by the fixing plates 35 and 36. Therefore, in addition to the increased connecting strength of the FFC (11) connecting structure of the third embodiment, the holding effect is achieved, and therefore there can be obtained the connecting structure of higher reliability.

Next, the structure of connecting the inner end portion 11B of the FFC 11 to the connector portion 23B will be described with reference to FIG. 8. As shown in this Figure, the inner end portion 11B of the FFC 11 is connected to a wiring board 15B through a guide recess 41A in an FFC guide plate 41, for example, as in the connecting structure of the first embodiment.

A solder leveler is formed on an obverse surface of each wiring terminal pattern 16 of the wiring board 15B. In FIG. 8, reference numeral 42 denotes a screw by which the wiring board 15B is fixedly secured to the connector portion 23B. Fixing plates 43 and 44, which hold the end portion 11B of the FFC 11, connected to the wiring board 15B, from the lower side, are mounted on the FFC guide plate 41. Thus, the inner end portion 11B of the FFC 11 is connected to the wiring board 15B, and are held by the fixing plates 43 and 44. Therefore, in addition to the increased connecting strength of the FFC (11) connecting structure of the first embodiment, the holding effect is achieved, and therefore there can be obtained the connecting structure of higher reliability.

The present invention is not limited to the above-mentioned embodiments, but various modifications, relevant to the subject matter of the construction, can be made.

For example, although the FFC 11 is used as the flat circuit member in each of the above embodiments, an FPC can be used. In each of the above embodiments, although the soldering leveler and solder are formed on the wiring terminal pattern so as to effect the soldering operation, the soldering can be carried out by any other suitable method. In each of the above embodiments, each of the above embodiments can be applied to various steering-signal transmitting devices 20 employing a spiral cable.

As is clear from the foregoing description, In the invention, the other (upper) covering film is removed at the end portion of the flat circuit member over the region closer to the end of the flat circuit member than the end of the one (lower) covering film disposed at the soldering side, and covers part of the wiring terminal patterns. Therefore, the other covering film, overlying and covering the soldering region of the wiring terminal patterns, serves to reinforce the connecting boundary portion between the soldering region of the wiring terminal patterns and the flat circuit member. Therefore, the durability of the connection of the flat circuit member can be enhanced, so that the connecting structure of high reliability can be achieved.

In the invention, in addition to the above effects of the invention, the connecting strength of the opposite end portions of the spiral cable, used in the steering signal-transmitting device, is increased, thereby enhancing the reliability. Therefore, a signal and electric power can be positively fed to an auxiliary device such for example as an air bag device provided at a steering wheel.

In the invention, the soldering leveler is formed on the surface of each wiring terminal pattern, and therefore in addition to the above effects of the invention, when the conductor is heated, heat transfers through the conductor, so that the exposed conductor can be easily soldered to the soldering leveler disposed below the conductor.

In the invention, each wiring terminal pattern is formed integrally with the wiring formed in the through hole formed through the board, and therefore in addition to the above effects of the invention, even when an external stress is applied to the flat circuit member, this stress is received by the wiring terminal patterns and the wirings in the respective through holes, so that the wiring terminal patterns are prevented from separating from the board.

In the invention, the wiring in the through hole is formed integrally with the wiring pattern formed on the reverse surface of the board, and therefore in addition to the above effects of the invention, the effect of preventing the separation of the wiring terminal patterns is further enhanced. And besides, a connection member, such as a connector, can be electrically connected to the board, using the wiring patterns formed on the reverse surface of the board. Furthermore, since the wiring patterns are formed on that side of the board facing away from the soldering side, the wiring patterns are prevented from being affected by heat generated during the soldering operation.

What is claimed is:

1. A flat circuit member connecting structure comprising:
   a flat circuit member including a plurality of parallel conductors spaced at predetermined intervals, a first covering film and a second covering film, wherein the first and second covering films hold the plurality of conductors therebetween; and
   a plurality of wiring terminal patterns formed on a surface of a wiring board, wherein the plurality of conductors are soldered to the corresponding wiring terminal patterns and the first covering film faces the wiring board,
   wherein the first covering film is removed at an end portion of the flat circuit member over a first length corresponding to a soldering region on the wiring terminal patterns for exposing the conductors,
   wherein the second covering film is removed at the end portion of the flat circuit member over a length shorter than the first length, and covers a part of the wiring terminal patterns.

2. The flat circuit member connecting structure according to claim 1, wherein the flat circuit member is a spiral cable used in a steering signal-transmitting device.

3. The flat circuit member connecting structure according to claim 1, wherein a solder leveler is formed on a surface of each of the wiring terminal patterns.

4. A flat circuit member connecting structure comprising:
   a flat circuit member including a plurality of parallel conductors spaced at predetermined intervals, a first covering film and a second covering film, wherein the first and second covering films hold the plurality of conductors therebetween; and
   a plurality of wiring terminal patterns formed on a surface of a wiring board, wherein the plurality of conductors are soldered to the corresponding wiring terminal patterns and the first covering film faces the wiring board,
   wherein each of the wiring terminal patterns is formed integrally with a wiring formed in a through hole formed through the wiring board,
   wherein the first covering film is removed at an end portion of the flat circuit member over a first length corresponding to a soldering region on the wiring terminal patterns for exposing the conductors, and
   wherein the second covering film is removed at the end portion of the flat circuit member over a length shorter than the first length shorter than the first length, and covers a part of the wiring terminal patterns.

5. The flat circuit member connecting structure according to claim 4, wherein the wiring in the through hole is formed integrally with a wiring pattern formed on a reverse surface of the wiring board.

6. The flat circuit member connecting structure according to claim 1, wherein a distal end of each of the conductors is covered with the first and second covering films.

7. A flat circuit member connecting structure comprising:
   a flat circuit member including a plurality of parallel conductors spaced at predetermined intervals, a first covering film and a second covering film, wherein the first and second covering films hold the plurality of conductors therebetween, and end portions of the conductors are exposed from the first and second covering films; and
   a plurality of wiring terminal patterns formed on a surface of a wiring board, wherein the exposed conductors of the end of the plurality of conductors are soldered to the corresponding wiring terminal patterns and the first covering film faces and overlaps the wiring board,
   an extension portion extended from the second covering film, wherein a part of each of the exposed conductors is held between the extension portion and the wiring terminal patterns.

8. The flat circuit member connecting structure according to claim 7, wherein an exposed length of each of the exposed conductors in the second covering film side is smaller than that in the first covering film side.

* * * * *